(12) United States Patent
Song et al.

(10) Patent No.: US 9,013,891 B2
(45) Date of Patent: Apr. 21, 2015

(54) 3-D INTEGRATED PACKAGE

(75) Inventors: Yunpeng Song, Fremont, CA (US);
Yongsheng Liu, San Jose, CA (US);
Hongyu Deng, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 451 days.

(21) Appl. No.: 13/417,103

(22) Filed: Mar. 9, 2012

(65) Prior Publication Data
US 2013/0235542 A1    Sep. 12, 2013

(51) Int. Cl.
*H05K 7/00*  (2006.01)
*H05K 1/00*  (2006.01)
(Continued)

(52) U.S. Cl.
CPC .............. *H05K 1/0243* (2013.01); *H01P 1/047* (2013.01); *H01P 3/003* (2013.01); *H01P 5/08* (2013.01); *H05K 1/0227* (2013.01); *H05K 1/0251* (2013.01); *H05K 1/112* (2013.01); *H05K 2201/09236* (2013.01)

(58) Field of Classification Search
CPC .................. H01L 2924/00; H01L 2224/32225; H01L 2924/15311; H01L 2224/48091; H01L 2924/00014; H01L 2224/4824; H01L 2224/73215; H01L 2224/48227; H01L 2224/48465; H01L 2224/73265; H01L 25/0657; H01L 23/3107; H01L 2924/01087; H01L 2924/15331; H01L 2924/30107; H01L 2224/45124; H01L 2224/45144; H01L 23/3128; H01L 2924/01006; H01L 2924/01075; H01L 2924/19041; H01L 21/56; H01L 2224/0564; H01L 2225/06517; H01L 2225/06527; H01L 2225/06537; H01L 2225/06541; H01L 23/057; H01L 23/10; H01L 23/142; H01L 23/16; H01L 23/36; H01L 23/481; H01L 23/498; H01L 23/4286; H05K 3/429; H05K 2201/09236; H05K 1/0219; H05K 1/115; H05K 1/116; H05K 1/0222; H05K 1/0251; H05K 2201/09718; H05K 1/0245; H05K 2201/0715; H05K 2201/09809; H05K 2201/10189; H05K 1/0237; H05K 2201/1034; H05K 2201/10356; H05K 2201/10363; H05K 2201/10371; H05K 2201/10409; H05K 2201/10477; H05K 2201/1059; H05K 2201/10689; H05K 2201/10825; H05K 2201/2036; H05K 2203/0278; H01P 5/08; H01P 1/047; H01P 1/2005; H01P 1/30; H01P 3/003; H01P 3/081; H01P 3/088; H01P 5/085
USPC ............ 361/803, 773, 784, 748, 679.01, 600, 361/772, 760; 174/262, 261, 266, 255, 68
See application file for complete search history.

(56) References Cited
U.S. PATENT DOCUMENTS
5,461,352 A * 10/1995 Noguchi et al. .............. 333/204
(Continued)

FOREIGN PATENT DOCUMENTS
KR    10-1997-0000386 B1    1/1997
KR    10-2007-0009596 A     1/2007

OTHER PUBLICATIONS
International Search Report and Written Opinion dated Jun. 27, 2013 as received in Application No. PCT/US2013/030076.

*Primary Examiner* — Tuan T Dinh
*Assistant Examiner* — Ahmad D Barnes
(74) *Attorney, Agent, or Firm* — Maschoff Brennan (57) ABSTRACT

An electronics package includes one or more insulating layers and an electrically conductive transmission line. The electrically conductive transmission line includes a signal trace disposed substantially parallel to the one or more insulating layers. The electrically conductive transmission line further includes one or more signal vias electrically coupled to the signal trace. The one or more signal vias are configured to pass through at least a portion of the one or more insulating layers. The electronics package further includes one or more electrically conductive ground planes substantially parallel to the one or more insulating layers. The ground planes include one or more signal via ground cuts. The one or more signal via ground cuts provide clearance between the one or more signal vias and the one or more ground planes.

14 Claims, 11 Drawing Sheets

(51) Int. Cl.
*H05K 1/18* (2006.01)
*H05K 1/14* (2006.01)
*H05K 1/11* (2006.01)
*H01R 9/00* (2006.01)
*H01P 1/04* (2006.01)
*H01P 3/00* (2006.01)
*H01P 5/08* (2006.01)
*H05K 1/02* (2006.01)

(56) References Cited

U.S. PATENT DOCUMENTS

| | | |
|---|---|---|
| 6,787,710 B2 * | 9/2004 | Uematsu et al. .............. 174/261 |
| 7,795,995 B2 | 9/2010 | White et al. |
| 2002/0179332 A1 | 12/2002 | Uematsu et al. |
| 2005/0098348 A1 * | 5/2005 | Okumichi et al. ............ 174/262 |
| 2009/0133913 A1 * | 5/2009 | Kushta et al. ................ 174/260 |

* cited by examiner

3-D INTEGRATED PACKAGE

BACKGROUND

1. Field of the Invention

Embodiments described herein relate generally to electrical interconnections in high-speed circuits. In particular, some example embodiments relate to vertical high-speed signal transitions through multilayer circuits.

2. Related Technology

Due to process technology limits and other design challenges, creating inexpensive and efficient packaging of components in high-speed circuits is difficult. Components frequently rely on bulky and/or expensive interconnections. Such interconnections include coaxial cable and microwave/radio frequency (RF) connectors such as GPPO interconnectors manufactured by Corning Gilbert Inc. or V-Connectors manufactured by Anritsu Company. In addition to high costs and space consumption, such cables and connectors introduce complexity to component packaging.

Coaxial cables and their associated connectors can be eliminated by using vertical signal interconnects. In this discussion, circuit layers are considered a horizontal reference, thus the term vertical refers to any across-layer orientation. However, vertical transitions can critically degrade performance when transmitting high-speed signals by introducing transmission losses, reflection losses, electromagnetic interference and reduced bandwidth, among other issues. Design challenges due to impedance mismatch can also be introduced when transitioning high-speed signal transmissions between a component package housing a vertical signal interconnect and a printed circuit board (PCB). Because of these design challenges, current component packaging making use of vertical transitions are suitable only for signal frequencies below 20 GHz. Thus, no satisfactory technology exists for replacing coaxial cables and associated connectors with surface-mountable electrical interconnections in high-speed circuits.

The subject matter claimed herein is not limited to embodiments that solve any disadvantages or that operate only in environments such as those described above. Rather, this background is only provided to illustrate one example technology area where some embodiments described herein may be practiced.

BRIEF SUMMARY OF SOME EXAMPLE EMBODIMENTS

Some embodiments described herein relate to systems for transitioning high-speed signals through multilayer circuits.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example embodiment, an electronics package includes one or more insulating layers and an electrically conductive transmission line. The electrically conductive transmission line includes a signal trace disposed substantially parallel to the one or more insulating layers. The electrically conductive transmission line further includes one or more signal vias electrically coupled to the signal trace. The one or more signal vias are configured to pass through at least a portion of the one or more insulating layers. The electronics package further includes one or more electrically conductive ground planes substantially parallel to the one or more insulating layers. The ground planes include one or more signal via ground cuts. The one or more signal via ground cuts provide clearance between the one or more signal vias and the one or more ground planes.

In another example embodiment, multiple component circuitry comprises a printed circuit board (PCB), a PCB signal trace disposed on the PCB, and an integrated circuit package mounted on the PCB. The integrated circuit package comprises a multilayer vertical transition. The multilayer vertical transition includes a plurality of transition layers. Each transition layer of the plurality of transition layers includes an insulating layer, a signal via that passes through the insulating layer, a ground plane disposed at a face of the insulating layer, and a plurality of ground vias. The signal via is electrically coupled with the signal via of an adjacent layer. The ground plane disposed at a face of the insulating layer includes a signal via ground cut which provides clearance between the ground plane and the signal via. The ground vias are configured to electrically couple the ground plane of the transition layer with the ground plane of an adjacent transition layer. The integrated circuit package further comprises an electrically conductive transmission line. The transmission line includes a coplanar waveguide portion electrically coupled to a microstrip portion and a capacitor electrically coupled to the microstrip portion. The capacitor is configured to block direct current while allowing alternating current to pass. The transmission line further includes the signal vias of the vertical transition. The transmission line further includes a signal pin electrically coupled to the signal vias. The signal pin is configured to be electrically coupled to the PCB signal trace at a package-PCB interface. An adjacent ground plane of the plurality of transition layers is adjacent to the package-PCB interface. The adjacent ground planes include a transition ground cut. The transition ground cut provides clearance between the adjacent ground plane and the signal pin at the package-PCB interface.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Embodiments described herein relate generally to electrical interconnections in high-speed circuits. The embodiments described herein may provide a space-efficient and inexpensive way to implement low-cost electrical interconnections in 3-D integrated packages.

Example embodiments disclosed herein are configured such that standard electronics package configurations can be employed, obviating the need for specialized electronics packages, e.g., specialized integrated circuit (IC) and optoelectronic circuit (OC) packages commonly used in high-speed circuits, such as GPPO-equipped packages. In several example embodiments, surface mount electronics packages can be employed. Some example high-speed interconnects disclosed herein can be employed to simplify the complexity of electrical component design while enabling transfer of high-speed signals between constituent packages. In some embodiments, the example interconnects disclosed herein may be less expensive and/or less complex than interconnects that employ coaxial cable and GPPO or V-Connectors.

Figure 1:
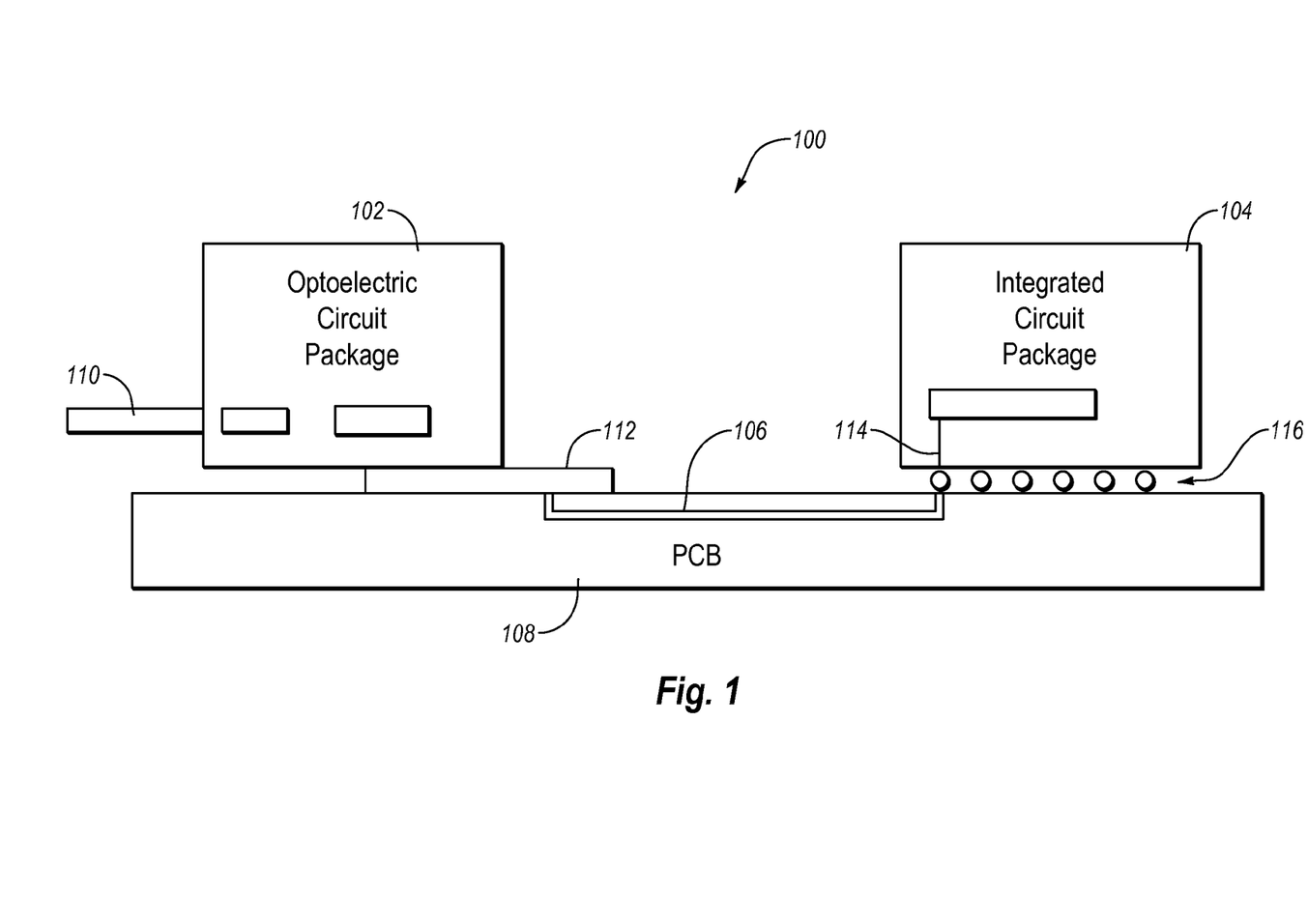
FIG. 1 is a simplified block diagram of a high-speed transponder in which some embodiments may be used.

With reference to FIG. 1, an example application in which vertical transitions can be used to transfer high-speed signals between packages in a high-speed transponder 100 is disclosed. A high-speed transponder 100 is shown and described; however, the embodiments described herein may be used in other multiple component circuitries. For the purposes of this application, vertical transitions refer to transitions that pass through one or more insulating layers in an electronics package. An OC package 102 interfaces with an IC package 104 via RF traces 106 in a PCB 108 and various intermediate connections. OC package 102 transmits and/or receives optical signals to/from an external circuit or device through a fiber 110 and transmits and/or receives high-speed electrical signals through intermediate connections 112, which may include conductors in a flex circuit or leads designed for routing high-speed electrical signals to and from the RF traces 106. OC package 102 may integrate various optoelectronic components such as a laser, a photodiode, a transimpedance amplifier, a laser driver, etc.

IC package 104 transmits and/or receives high-speed electrical signals to and/or from RF traces 106 through vertical transitions 114 and a surface mount interface 116. Surface mount interface 116 may include, for example, an array of solder joints such as a ball grid array (BGA), a pin grid array (PGA), a land grid array (LGA), pins, leads, or the like. IC package 104 may integrate or include one or more components such as a multiplexer/demultiplexer, a serializer/deserializer, a clock and data recovery circuit, or the like or any combination thereof. The vertical transitions 114 can be implemented using vias and intermediate ground planes with signal via ground cuts. Example embodiments of the vertical transitions 114 are disclosed in more detail with reference to FIGS. 2A-3C below.

In some example applications, an electronics package containing a vertical transition is connected to a PCB. In some of these example applications, high-speed signals pass between the package and the PCB at an interface of the package and PCB (hereinafter the "package-PCB interface"). In some embodiments, intermediate ground planes and transition ground cuts at the package-PCB interface as disclosed with reference to FIGS. 5A-5C can be used to lessen signal degradation, including impedance mismatch. In several embodiments, signal degradation may be lessened using a coplanar waveguide-to-microstrip transition to allow mounting of a capacitor with minimized discontinuity as disclosed in more detail with reference to FIG. 6.

Figure 2A:
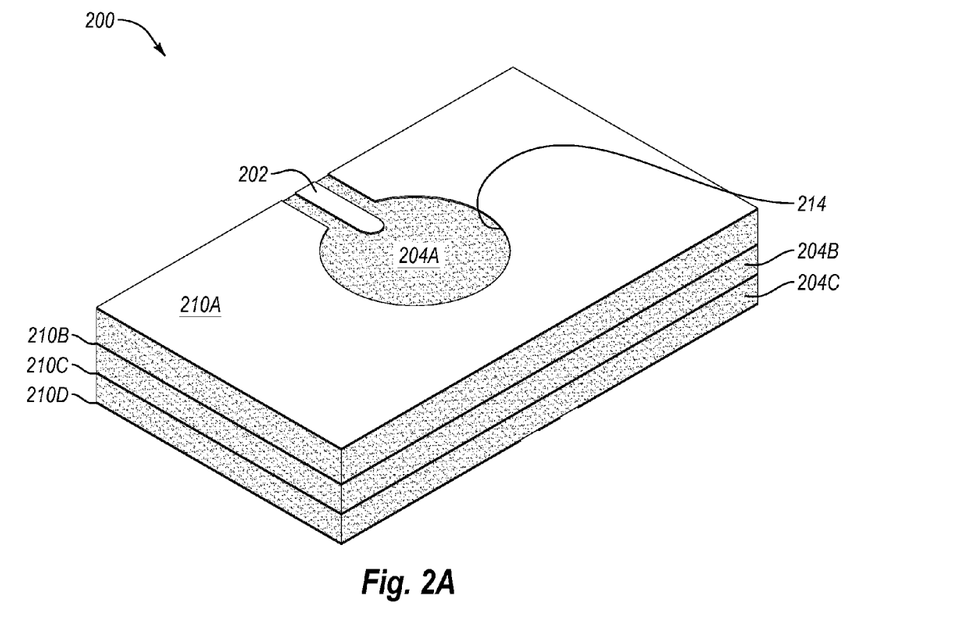
FIG. 2A illustrates a perspective view of a vertical transition in accordance with some embodiments.

With reference to FIG. 2A, a vertical transition 200 according to some embodiments is disclosed. The vertical transition 200 may be configured to transmit high-speed signals. The vertical transition 200 may correspond to the vertical transition 114 of FIG. 1, for example. The vertical transition 200 may include a first signal trace 202. The first signal trace 202 can be located at a surface of an insulating layer 204A. The vertical transition 200 may generally include multiple insulating layers 204A-204C (collectively "insulating layers 204").

Figure 2B:
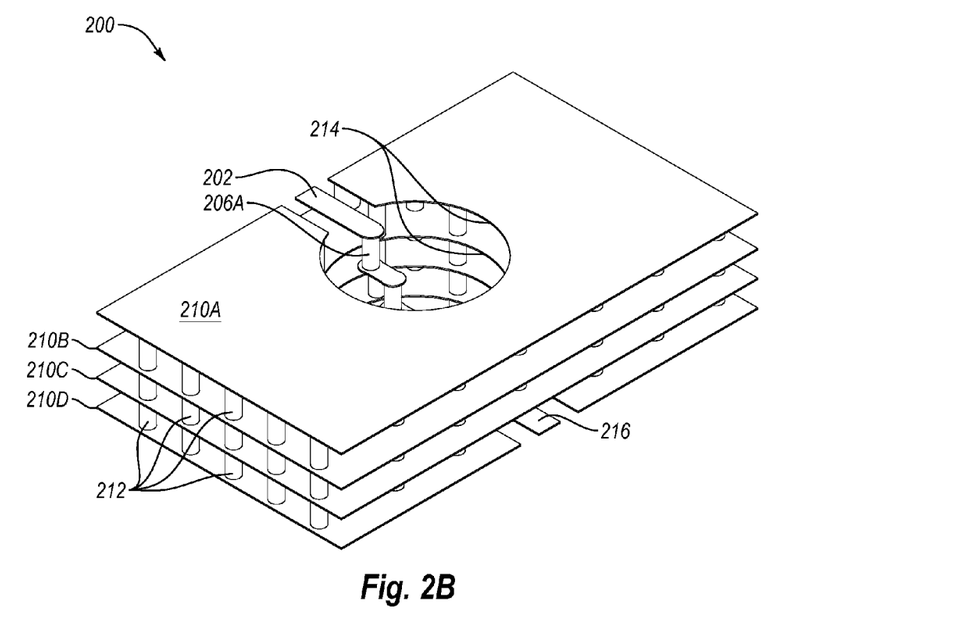
FIG. 2B illustrates the vertical transition of FIG. 2A with various insulating layers omitted.
Figure 2C:
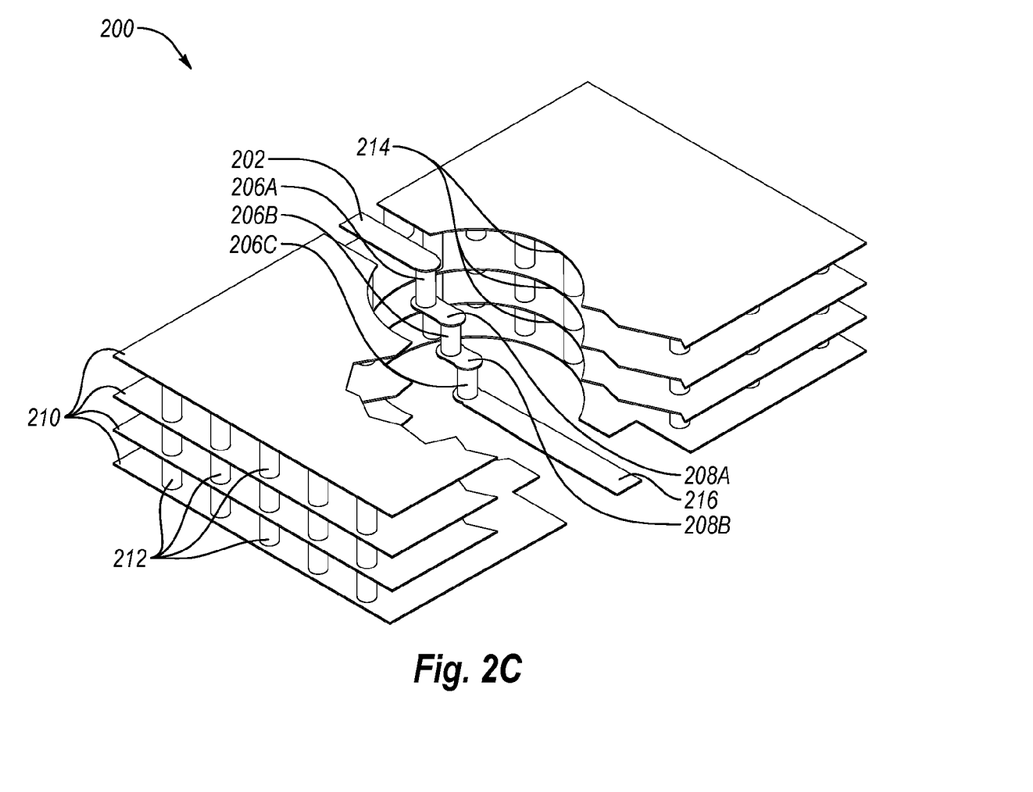
FIG. 2C illustrates a cutaway view of the vertical transition of FIG. 2B.

FIG. 2B illustrates the vertical transition 200 of FIG. 2A with the various insulating layers 204 omitted for clarity. FIG. 2C illustrates a cutaway view of the vertical transition 200 of FIG. 2B. Referring to FIGS. 2A-2C, the first signal trace 202 is electrically coupled with a signal via 206A. The signal via 206A passes through the insulating layer 204A. In some embodiments, the vertical transition 200 may additionally include signal vias 206B, 206C, that respectively pass through insulating layers 204B and 204C. Individual signal vias 206A-206C (collectively "signal vias 206") may be electrically coupled with adjacent signal vias 206. Alternately or additionally, intermediate signal traces 208A-B (collectively "intermediate signal traces 208") at surfaces of the insulating layers 204B-204C may be electrically coupled to the signal vias 206 and can allow staggering of signal vias 206. In some embodiments, the signal vias 206 are not staggered, but are instead axially aligned. In certain embodiments, the signal vias 206 may be electrically coupled directly to one another without intermediate signal traces 208. The first signal trace 202, signal vias 206, intermediate signal traces 208, and/or second signal trace 216 may collectively form an electrically conductive transmission line.

Generally, when signal vias are used to transmit high-speed signals through an insulating layer, the signal can be degraded by, at least in part, via inductance. To compensate for via inductance and to otherwise improve the vertical transmission of high-speed signals, ground planes 210A-210D (collectively "ground planes 210") can be formed at the surface of the insulating layers 204. The ground planes 210 can be electrically coupled to each other through ground vias 212, one or more of which may pass through each of the insulating layers 204 to interconnect adjacent ground planes 210.

Signal via ground cuts 214 can be formed in the ground planes 210 around the signal vias 206. The signal via ground cuts 214 provide clearance between the ground planes 210 and the signal vias 206. The ground planes 210 and the signal via ground cuts 214 may be configured to lessen the degradation of high-speed signals that otherwise occurs when signal vias 206 are used to transmit high-speed signals. The signal via ground cuts 214 are represented in FIGS. 2A-2C as substantially circular; however, the shape of one or more signal via ground cuts 214 can vary. For example, the shape of one or more signal via ground cuts 214 can be ovoid, elliptical, polygonal, or other suitable shape. The number of ground planes 210, as well as signal trace 202, 208 dimensions, signal via 206 dimensions, and signal via ground cut 214 dimensions can be selected so as to optimize efficiency of signal transmission, for example, through employing standard optimization techniques.

The vertical transition 200 may additionally include a second signal trace 216 at a bottom surface of an insulating layer 204C. The second signal trace 216 may be electrically coupled to the signal via 206C. The first signal trace 202, signal vias 206, intermediate signal traces 208, second signal trace 216, ground planes 210, and ground vias 212 can be composed of the same and/or different electrically conductive material(s). The insulating layers 204 can be composed of the same and/or different insulating material(s). Characteristics of the materials used for the insulating and electrically conductive materials, as well as the thickness of the insulating layers, can be selected so as to optimize efficiency of signal transmission, for example, through employing standard optimization techniques.

A single insulating layer 204, along with the signal vias 206 that pass through the single insulating layer 204, ground planes 210 at a surface of the single insulating layer 204, and/or any first, second or intermediate signal traces 202, 208, 216 may collectively form a transition layer. Vertical transitions including multiple transition layers may form a multi-layer vertical transition. While the vertical transition 200 of FIGS. 2A-2C is depicted as including three insulating layers 204 between the first signal trace 202 and the second signal trace 216, more generally, vertical transitions in accordance with the embodiments described herein may include virtually any number of insulating layers 204 between the first and second signal traces 202, 216. Indeed, a vertical transition 200 may be configured to have virtually any desired height by including a corresponding number of insulating layers 204 between the first and second signal traces 202, 216. Alternately or additionally, multiple vertical transitions, such as a pair of vertical transitions, may be provided in the same structure according to a desired application, such as differential signaling. An example embodiment involving more than three insulating layers 204 and a pair of vertical transitions in the same structure will now be described with respect to FIGS. 3A-3C.

Figure 3A:
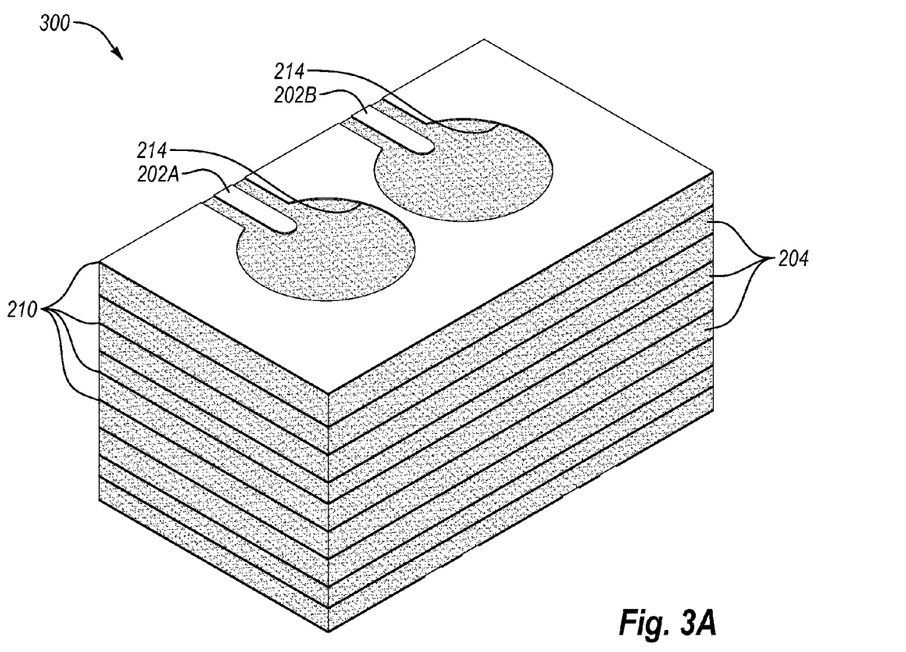
FIG. 3A illustrates a perspective view of a structure including vertical transitions for differential signals in accordance with some embodiments.
Figure 3B:
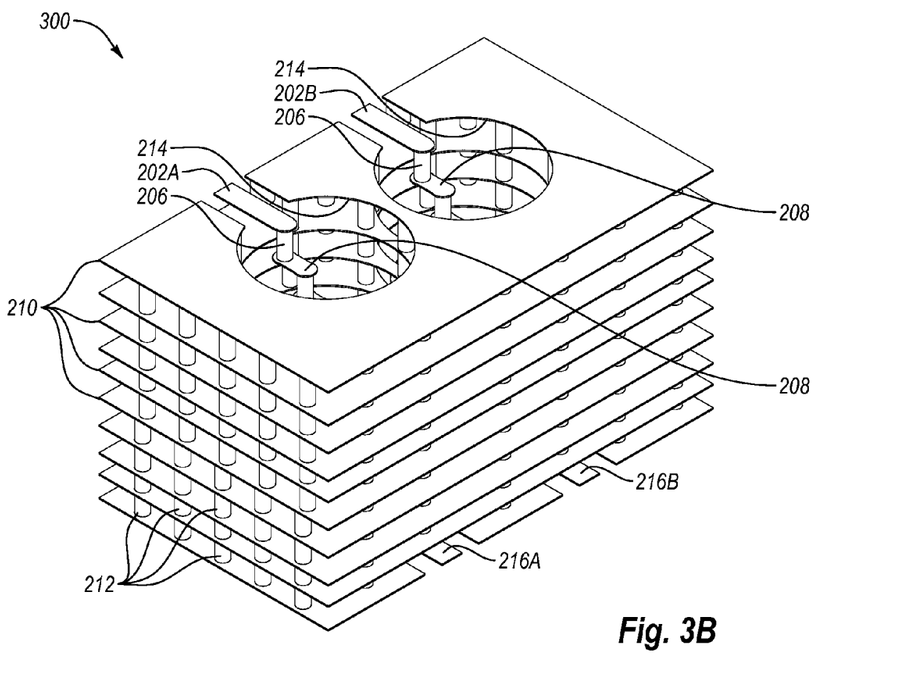
FIG. 3B illustrates the structure of FIG. 3A with various insulating layers omitted.
Figure 3C:
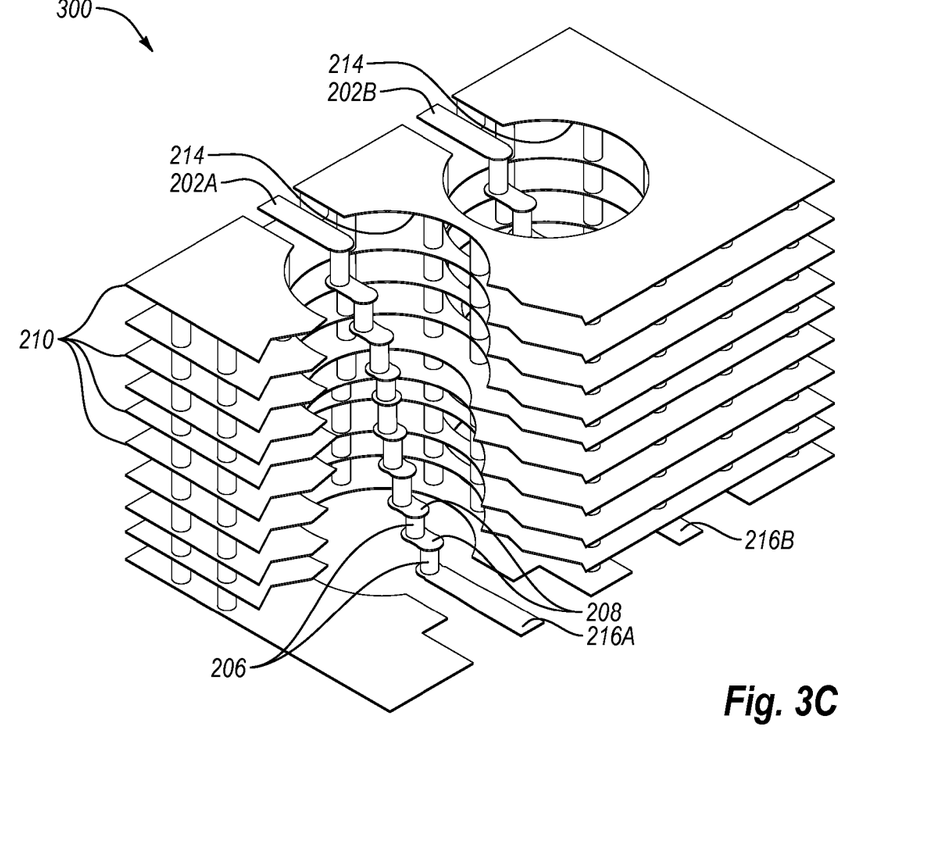
FIG. 3C illustrates a cutaway view of the structure of FIG. 3B.

FIG. 3A illustrates a perspective view of a structure 300 including a pair of vertical transitions for transmission of differential signals. FIG. 3B illustrates the structure 300 of FIG. 3A with various insulating layers omitted. FIG. 3C illustrates a cutaway view of the structure 300 of FIG. 3B.

With combined reference to FIGS. 3A-3C, the structure 300 may include a pair of first signal traces 202A, 202B, insulating layers 204, signal vias 206, intermediate signal traces 208, ground planes 210, ground vias 212, signal via ground cuts 214, and a pair of second signal traces 216A, 216B. The first signal traces 202A, 202B, insulating layers 204, signal vias 206, intermediate signal traces 208, ground planes 210, ground vias 212, signal via ground cuts 214, and second signal traces 216A, 216B may generally correspond to the first signal trace 202, insulating layers 204, signal vias 206, intermediate signal traces 208, ground planes 210, ground vias 212, signal via ground cuts 214, and second signal trace 216 of FIGS. 2A-2C. The first signal traces 202A, 202B, signal vias 206, intermediate signal traces 208, and/or second signal traces 216A, 216B may collectively form one or more electrically conductive transmission lines.

As noted above, vertical transitions such as those described herein can cover various vertical distances between the first signal traces 202A-B and the second signal traces 216A-B in different embodiments. The vertical distance in these and other embodiments may refer to the shortest distance between a plane including the first signal traces 202A, 202B and a plane including the second signal traces 216A, 216B. Various numbers of insulating layers 204, ground planes 210, ground vias 212, signal via ground cuts 214, signal vias 206, and intermediate signal traces 208 can also be used. The numbers of components can be selected so as to optimize efficiency of signal transmission and/or according to a desired application. According to one example embodiment, the vertical distance can be about 1.8 millimeters, with nine insulating layers 204 and a signal via 206 diameter of 100 micrometers. In some embodiments, the vertical distance can be up to about 5 centimeters or as little as about 50 micrometers.

Figure 4A:
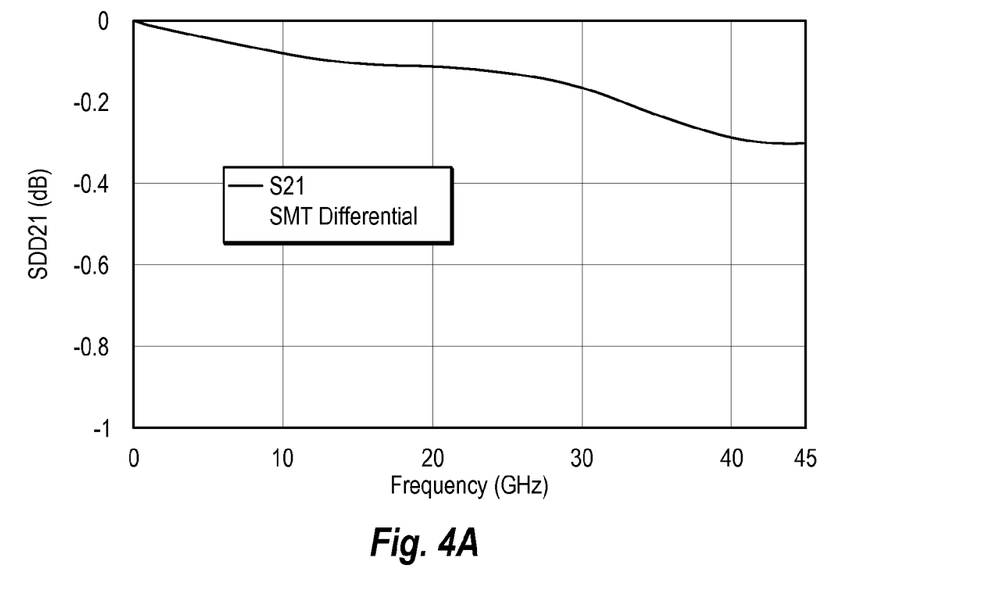
FIG. 4A is a plot of forward transmission (insertion loss) characteristics of the vertical transitions of FIGS. 3A-3C according to some embodiments.
Figure 4B:
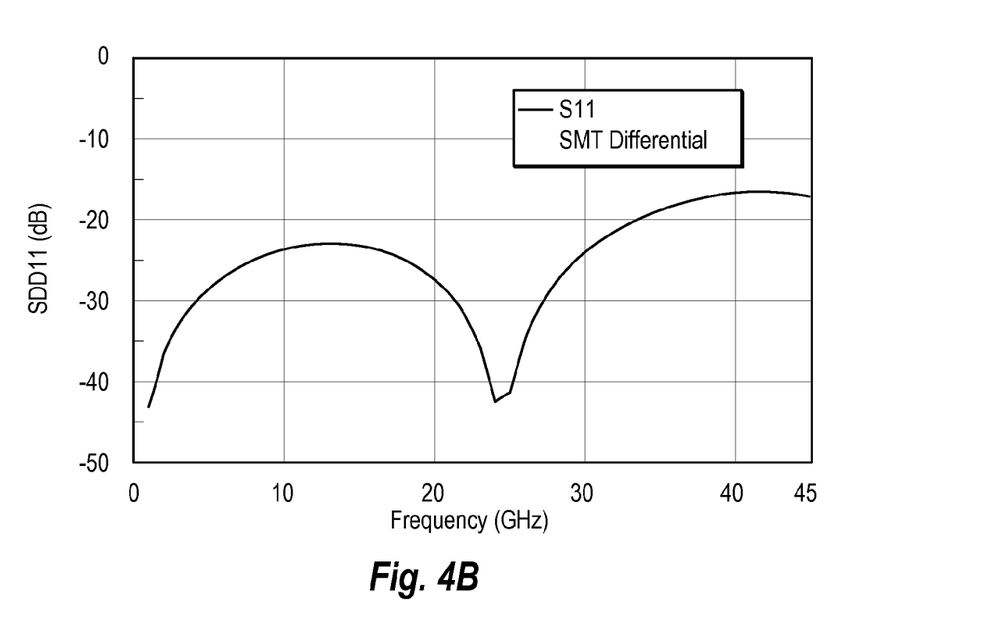
FIG. 4B is a plot of reflection (return loss) characteristics of the vertical transitions of FIGS. 3A-3C according to some embodiments.

FIG. 4A is a plot showing the forward transmission (insertion loss S21) characteristics of the structure 300 shown in FIGS. 3A-3C. FIG. 4B is a plot showing the reflection (return loss S11) characteristics of the structure 300 shown in FIGS. 3A-3C. As illustrated in FIGS. 4A-4B, some embodiments of the vertical transitions described herein may have suitably low insertion loss and return loss for use in high-speed signal applications up to, e.g. 45 GHz and beyond.

Figure 5A:
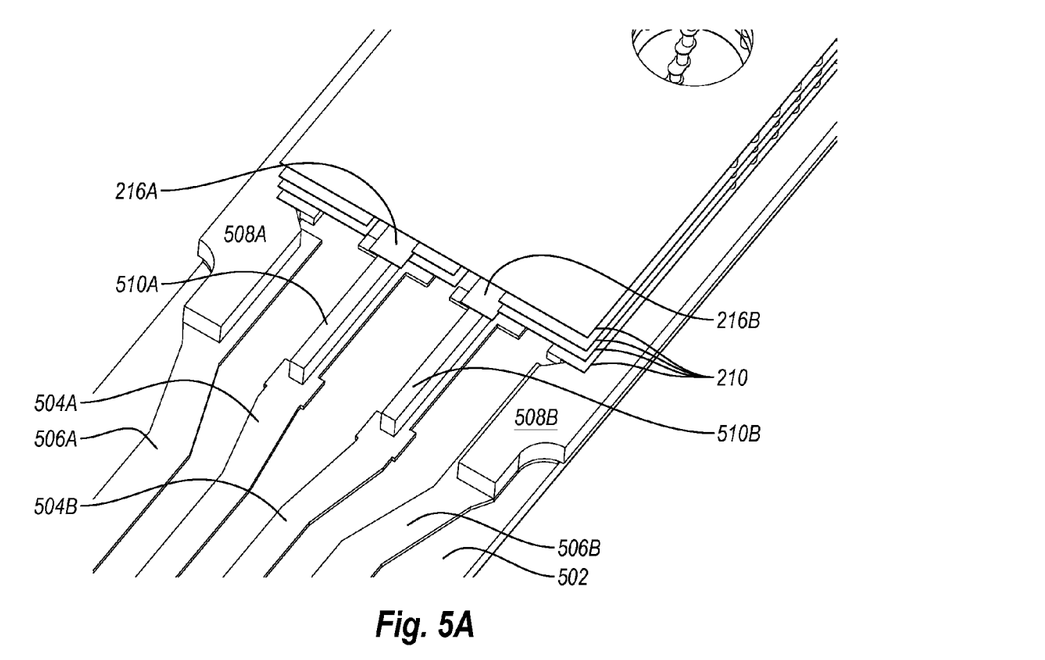
FIG. 5A illustrates a perspective view of a PCB transition according to some embodiments with various insulating layers omitted.

FIG. 5A illustrates a perspective view of a PCB transition according to some embodiments, with various insulating layers omitted for clarity. A PCB is shown and described herein; however, the embodiments described herein may be used with any electronics component that may be electronically coupled to an electronics package. In some embodiments, a package including one or more vertical transitions may be electrically coupled with a PCB 502 so high-speed signals may pass between the package and the PCB 502. In some embodiments, an impedance mismatch may occur between the electronics package and the PCB, for example, if the electronics package includes a ceramic material. Transmission of high-speed signals can be impacted by impedance mismatches and minimizing impedance mismatch can improve the transmission of high-speed signals.

In some embodiments, the PCB 502 can have on it PCB signal traces 504A-504B and PCB ground traces 506A-506B. The PCB signal traces 504A-504B can be electrically coupled to signal pins 510A-510B of the package. The signal pins 510A-510B are shown as protrusions from the electronics package; however, the signal pins 510A-510B may instead be configured as pads, as portions of the second signal traces 216A-216B, or as any other configuration that may be electrically coupled to an electronics component, e.g., a PCB external to the electronics package. The signal pins 510A-510B can be electrically coupled to second signal traces 216A-216B of the package. The ground traces 506A-506B can be electrically coupled to ground pins 508A-508B of the package. The ground pins 508A-508B can be electrically coupled to ground planes 210 of the package. The second signal traces 216A-216B and the ground planes 210 may generally correspond to the second signal traces 216A-216B and the ground planes 210 of FIGS. 2A-2C and 3A-3C. The signal pins 510A, 510B and the second signal traces 216A, 216B may collectively form one or more electrically conductive transmission lines.

Figure 5B:
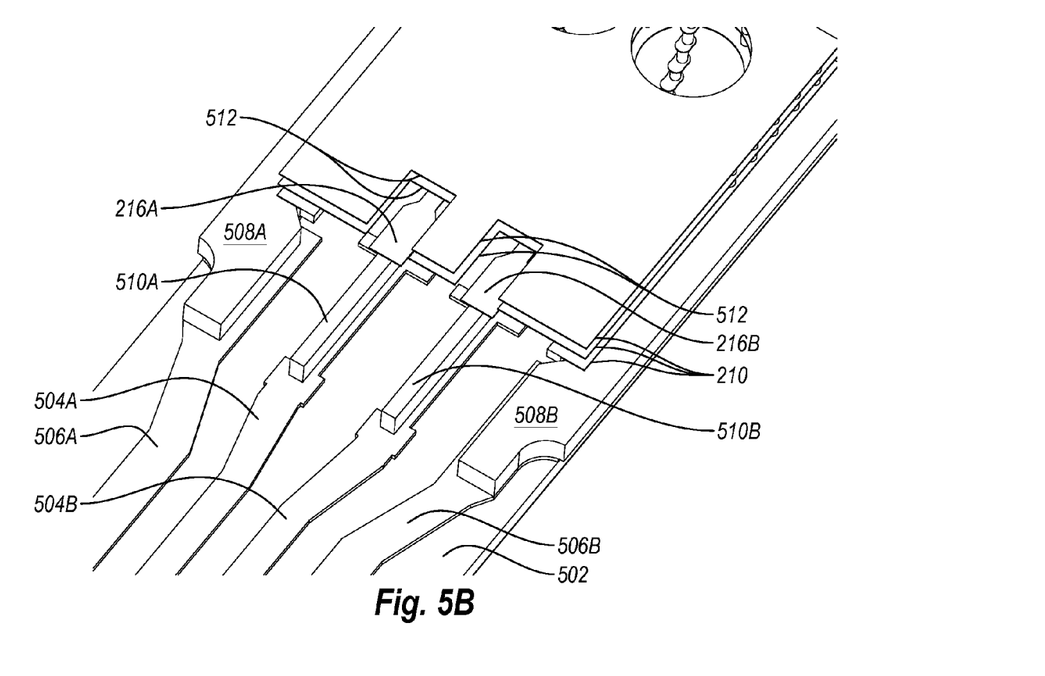
FIG. 5B illustrates the PCB transition of FIG. 5A with an uppermost ground plane of the PCB transition omitted.
Figure 5C:
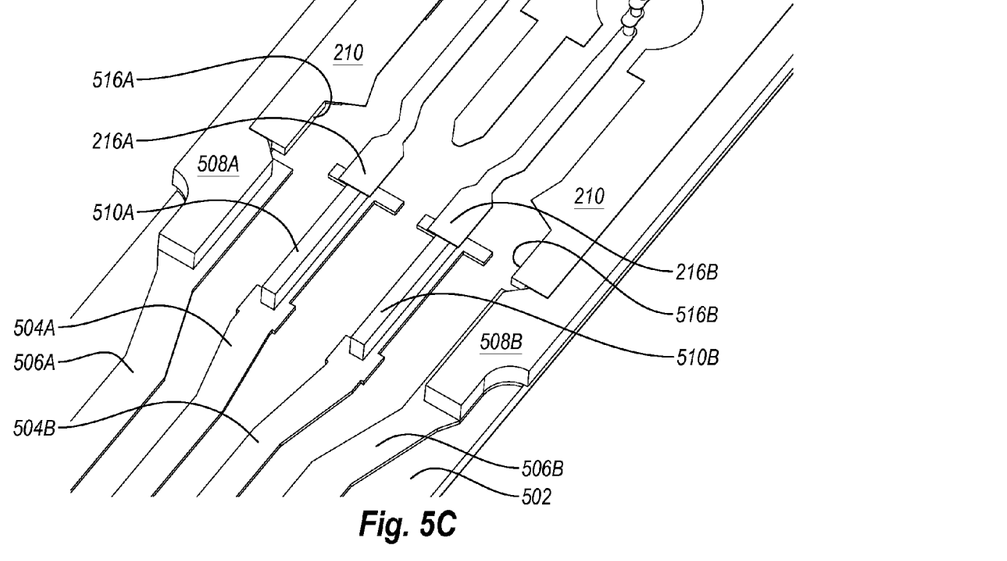
FIG. 5C illustrates the PCB transition of FIGS. 5A-B with some intermediate ground planes omitted.

FIG. 5B illustrates the PCB transition of FIG. 5A with the topmost ground plane omitted for clarity. In some embodiments, the impedance mismatch between the electronics package and PCB is at least partially overcome using transition ground cuts 512 near at least a portion of the second signal traces 216A-216B and signal pins 510A-510B. The transition ground cuts 512 provide clearance between the ground planes 210 and at least a portion of the signal pins 510A-510B and second signal traces 216A-216B. In some embodiments, the transition ground cuts 512 provide clearance around a location where the signal pins 510A-510B contact the PCB signal traces 504A-504B. The transition ground cuts 512 are represented here as substantially rectangular; however, the shape of one or more transition ground cuts 512 can vary. For example, the shape of one or more transition ground cuts 512 can be ovoid, elliptical, polygonal, or other suitable shape. FIG. 5C illustrates the PCB transition of FIGS. 5A-5B with some intermediate ground planes omitted. Electromagnetic transitions from the signal pins 510A-510B to PCB signal traces 504A-504B can be further improved by the shape of the PCB signal traces 504A-504B and cutbacks 516A-516B in the ground plane 210 in-plane with the second signal traces 216A-216B. PCB signal trace 504A-504B shape and cutbacks 516A-516B can be selected so as to optimize efficiency of signal transmission.

Figure 6:
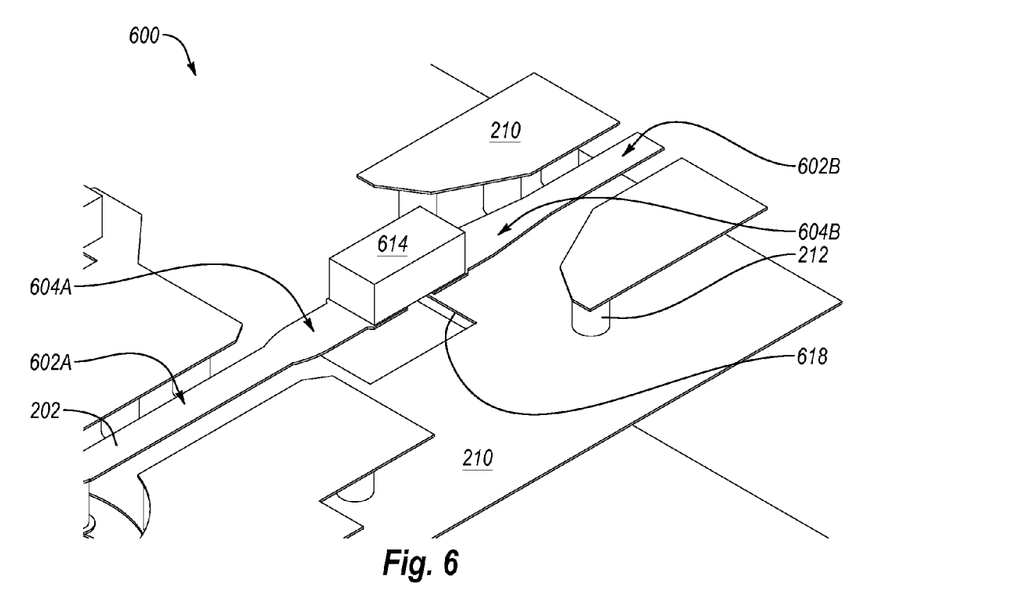
FIG. 6 illustrates a perspective view of a coplanar waveguide-to-microstrip transition and mounted capacitor according to some embodiments.

FIG. 6 illustrates a perspective view of a coplanar waveguide-to-microstrip transition and mounted capacitor according to some embodiments. Structure 600 can include coplanar waveguide signal lines 602A-602B and microstrip signal lines 604A-604B. Ground planes 210 electrically coupled by ground vias 212 can form the ground planes 210 that correspond to the coplanar waveguide signal lines 602A-602B and microstrip signal lines 604A-604B. The ground planes 210 and ground vias 212 may generally correspond to the ground planes 210 and ground vias 212 of FIGS. 2A-2C, 3A-3C, and 5A-5C. The coplanar waveguide signal lines 602A-602B can be electrically coupled with the microstrip signal lines 604A-604B. The coplanar waveguide 602A can be electrically coupled to a first signal line 202. The first signal line 202 may generally correspond to the first signal line 202 of FIGS. 2A-2C, and the first signal line 202B of FIGS. 3A-3C. In some embodiments, the microstrip signal lines 604A-604B are wider than the coplanar waveguide signal lines 602A-602B; facilitating mounting of a capacitor 614 to the microstrip signal lines 604A-604B. In some embodiments, the capacitor 614 may be a direct current (DC) blocking capacitor. A DC blocking capacitor may be configured to generally block direct current while allowing alternating current to pass. A DC blocking capacitor may be configured to minimize signal discontinuity. In certain embodiments, a capacitor ground cut 618 can be formed in the ground plane 210 beneath the capacitor 614 to minimize impedance mismatch. Two coplanar waveguide-to-microstrip transitions are shown; however, in certain embodiments, only one such coplanar waveguide-to-microstrip transition may be used. The coplanar waveguide signal lines 602A, 602B, microstrip lines 604A, 604B, capacitor 614, and/or first signal line 202 may collectively form an electrically conductive transmission line.

Figure 7A:
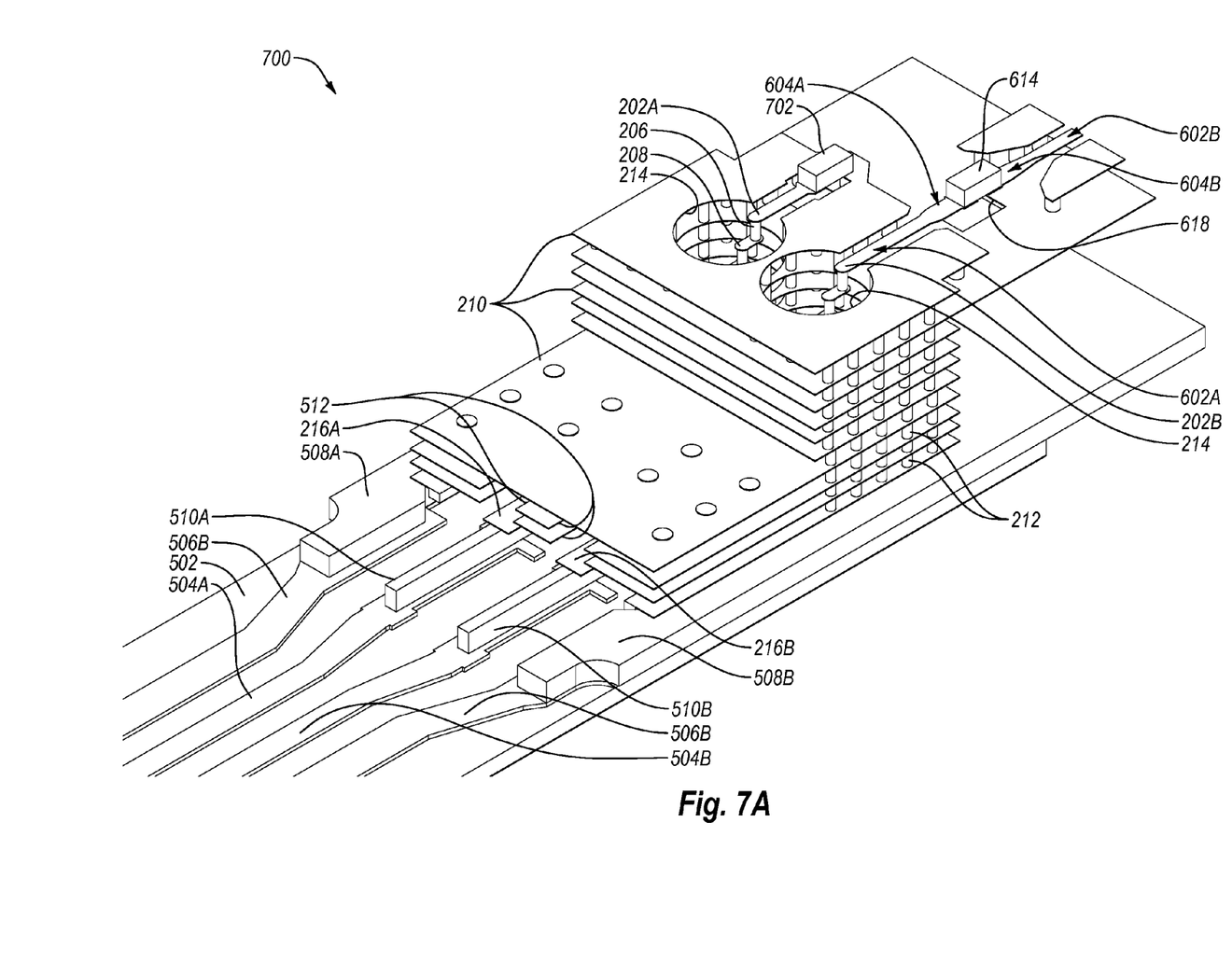
FIG. 7A illustrates a perspective view of a package and PCB assembly according to some embodiments with various insulating layers omitted.
Figure 7B:
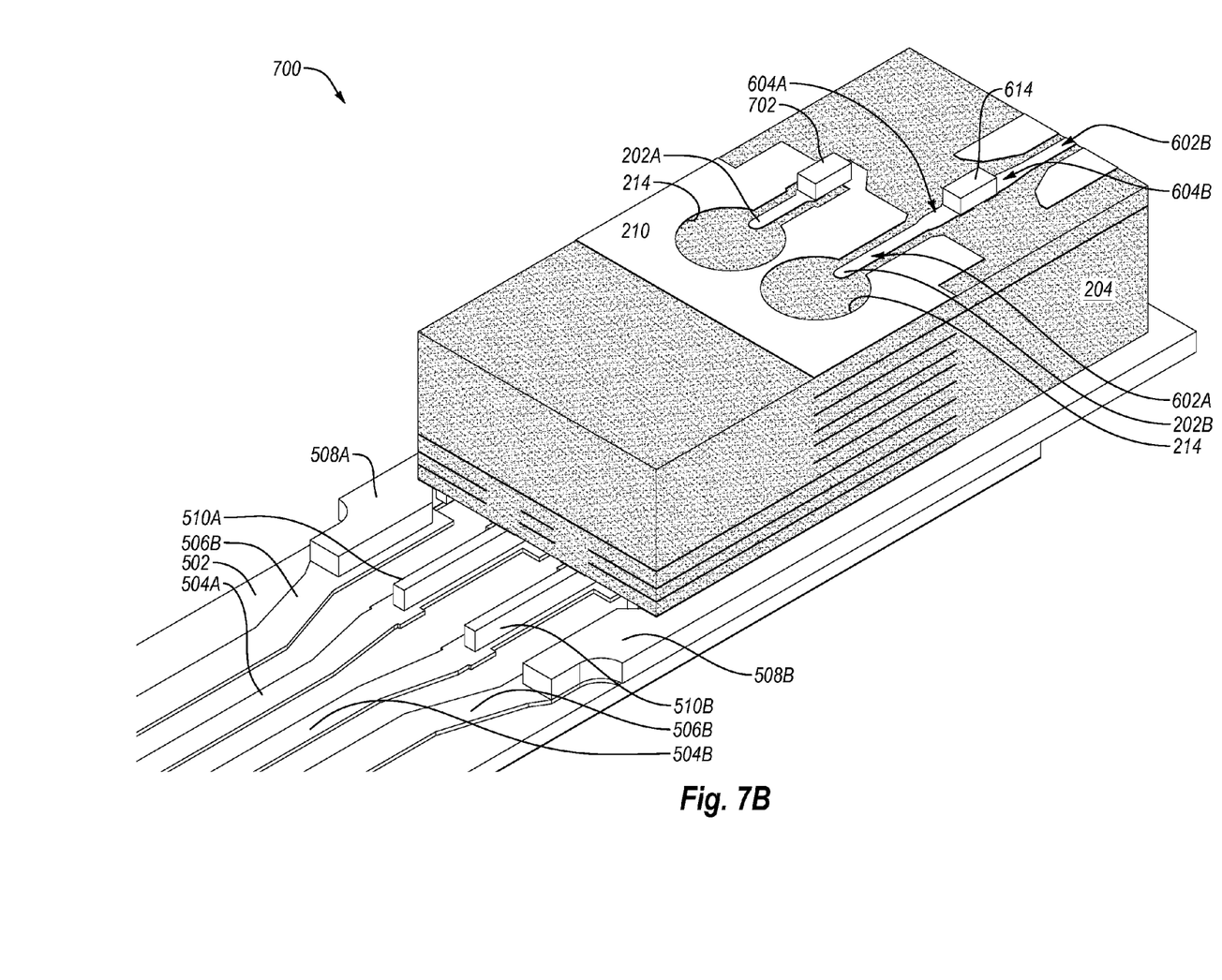
FIG. 7B illustrates the package and PCB assembly of FIG. 7A with the various insulating layers included.

FIG. 7A illustrates a perspective view of a package and PCB assembly 700 according to some embodiments, with various insulating layers omitted for convenience. FIG. 7B illustrates the package and PCB assembly of 7A with the various insulating layers included. With combined reference to FIGS. 7A-7B, the package and PCB assembly 700 may include a pair of first signal traces 202A, 202B, insulating layers 204, signal vias 206, intermediate signal traces 208, ground planes 210, ground vias 212, signal via ground cuts 214, a pair of second signal traces 216A, 216B, a pair of ground pins 508A, 508B, a pair of signal pins 510A, 510B, a PCB 502, a pair of PCB signal traces 504A, 504B, a pair of PCB ground traces 506A, 506B, transition ground cuts 512, coplanar waveguide signal lines 602A, 602B, microstrip line signal lines 604A, 604B, DC blocking capacitor 614, and a capacitor ground cut 618. The ground planes 210 may generally correspond to the ground planes 210 of FIGS. 2A-2C, 3A-3C, 5A-5C and 6. The first signal traces 202A, 202B may generally correspond to the first signal trace 202 of FIGS. 2A-2C and 6, and the first signal traces 202A, 202B of FIGS. 3A-3C. The insulating layers 204, signal vias 206, intermediate signal traces 208, ground planes 210, ground vias 212, and signal via ground cuts 214 may generally correspond to the insulating layers 204, signal vias 206, intermediate signal traces 208, ground planes 210, ground vias 212, and signal via ground cuts 214 of FIGS. 2A-2C and 3A-3C. The second signal traces 216A, 216B may generally correspond to the second signal traces 216, 216A, 216B of FIGS. 2A-2C, 3A-3C and 5A-5C. The ground pins 508A, 508B, signal pins 510A, 510B, PCB 502, PCB signal traces 504A, 504B, PCB ground traces 506A, 506B, and transition ground cuts 512 may generally correspond to the ground pins 508A, 508B, signal pins 510A, 510B, PCB 502, PCB signal traces 504A, 504B, PCB ground traces 506A, 506B, and transition ground cuts 512 of FIGS. 5A-5C. The coplanar waveguide signal lines 602A, 602B, microstrip line signal lines 604A, 604B, capacitor 614, and capacitor ground cut 618 may generally correspond to the coplanar waveguide signal lines 602A, 602B, microstrip line signal lines 604A, 604B, capacitor 614, and capacitor ground cut 618 of FIG. 6.

In some embodiments, a termination 702 electrically couples the first signal trace 202A and the ground planes 210, for example, the termination 702 may be a 50 ohm termination resistor. In some embodiments, the vertical high-speed transition is electrically coupled to an IC at the transmission line 602B, for example, by electrically coupling the vertical high-speed signal transition to an IC via wirebond. In some embodiments, the PCB signal traces 504A-504B and ground traces 506A-506B are electrically coupled to an IC, for example, by electrically coupling the PCB traces to an IC via BGA. The coplanar waveguide signal lines 602A, 602B, microstrip lines 604A, 604B, capacitor 614, first signal traces 202A, 202B, signal vias 206, intermediate signal traces 208, second signal traces 216A, 216B, and/or signal pins 510A, 510B may collectively form one or more electrically conductive transmission lines.

Figure 8:
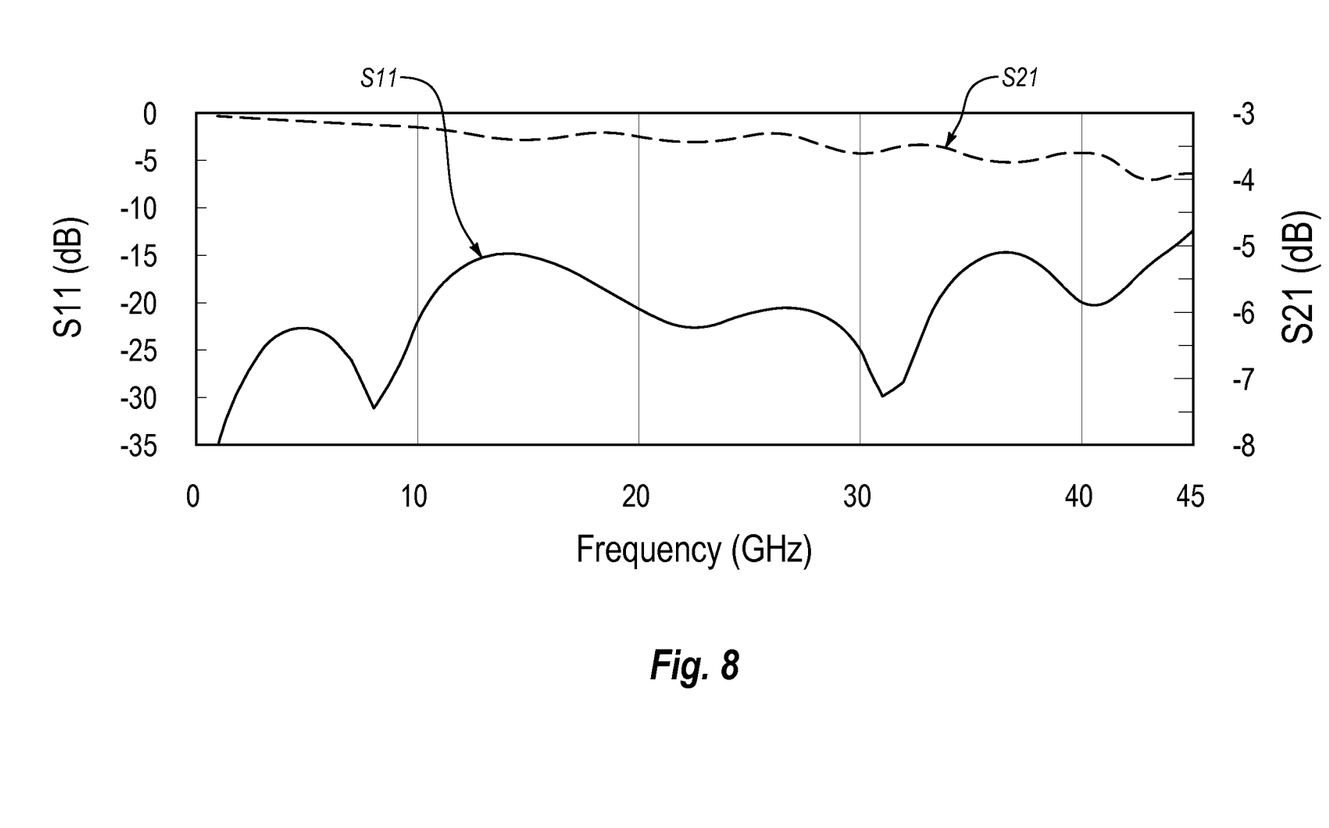
FIG. 8 is a plot of transmission (insertion loss) and reflection (return loss) characteristics of the package and PCB assembly of FIGS. 7A-B.

FIG. 8 is a plot showing the forward transmission (insertion loss S21) and the reflection (return loss S11) characteristics of the vertical transition for the package and PCB assembly 700 shown in FIGS. 7A-7B. As shown in FIG. 8, some embodiments of the vertical transitions described herein may have suitably low insertion loss and return loss for use in high-speed signal applications up to, e.g. 45 GHz and beyond.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electronics package comprising:
   a multilayer vertical transition, the multilayer vertical transition including:
      a plurality of transition layers, each transition layer of the plurality of transition layers including:
         an insulating layer;
         a signal via, wherein:
            the signal via passes through the insulating layer; and
            the signal via is electrically coupled with the signal via of an adjacent transition layer;
         a ground plane disposed at a face of the insulating layer, the ground plane including a signal cut, wherein the signal cut provides clearance between the ground plane and the signal via; and
         a plurality of ground vias, wherein the ground vias are configured to electrically couple the ground plane of the transition layer with the ground plane of an adjacent transition layer;
   an electrically conductive transmission line including:
      a coplanar waveguide portion electrically coupled to a microstrip portion;
      a capacitor electrically coupled to the microstrip portion, the capacitor configured to block direct current while allowing alternating current to pass;
      the signal vias of the multilayer vertical transition; and
      a signal pin electrically coupled to the signal vias, wherein the signal pin is configured to be electrically coupled to a printed circuit board (PCB) via a PCB signal trace deposited on the PCB; and
   wherein an adjacent ground plane of the plurality of transition layers is configured to be adjacent to a package-PCB interface formed when the electronics package is mounted to the PCB, the adjacent ground plane including a transition ground cut, and wherein the transition ground cut provides clearance between the adjacent ground plane and the signal pin.

2. The electronics package of claim 1, wherein the signal cuts are substantially circular.

3. The electronics package of claim 1, wherein the transition ground cut is formed along an edge of the adjacent ground plane.

4. The electronics package of claim 1, wherein the transition ground cut is substantially rectangular.

5. The electronics package of claim 1, wherein the electronics package includes a ceramic material.

6. The electronics package of claim 1, further including:
   a ground plane adjacent to the capacitor, the adjacent ground plane including a capacitor ground cut adjacent to the capacitor.

7. The electronics package of claim 1, wherein the signal vias of the plurality of transition layers are axially aligned.

8. The electronics package of claim 1, wherein the signal vias of the plurality of transition layers are staggered.

9. The electronics package of claim 1, wherein the electronics package is electrically coupled to an optoelectronic circuit.

10. Multiple component circuitry comprising:
    a printed circuit board (PCB);
    a PCB signal trace disposed on the PCB;
    an integrated circuit package mounted on the PCB, the integrated circuit package comprising:
       a multilayer vertical transition, the multilayer vertical transition including:
          a plurality of transition layers, each transition layer of the plurality of transition layers including:
             an insulating layer;
             a signal via, wherein:
                the signal via passes through the insulating layer; and
                the signal via is electrically coupled with the signal via of an adjacent transition layer;
             a ground plane disposed at a face of the insulating layer, the ground plane including a signal cut, wherein the signal cut provides clearance between the ground plane and the signal via; and
             a plurality of ground vias, wherein the ground vias are configured to electrically couple the ground plane of the transition layer with the ground plane of an adjacent transition layer;
       an electrically conductive transmission line, the transmission line including:
          a coplanar waveguide portion electrically coupled to a microstrip portion;
          a capacitor electrically coupled to the microstrip portion, the capacitor configured to block direct current while allowing alternating current to pass;
          the signal vias of the multilayer vertical transition; and
          a signal pin electrically coupled to the signal vias, wherein the signal pin is configured to be electrically coupled to the PCB signal trace at a package-PCB interface; and
       wherein an adjacent ground plane of the plurality of transition layers is adjacent to the package-PCB interface, the adjacent ground plane including a transition ground cut, wherein the transition ground cut provides clearance between the adjacent ground plane and the signal pin at the package-PCB interface.

11. The multiple component circuitry of claim 10, further comprising an optoelectronic circuit package mounted on the PCB.

12. The multiple component circuitry of claim 10, wherein the signal cut forms a substantially circular opening in the ground plane.

13. The multiple component circuitry of claim 10, wherein the signal vias of the plurality of transition layers are axially aligned.

14. The multiple component circuitry of claim 10, wherein the signal vias of the plurality of transition layers are staggered.

* * * * *